(12) United States Patent
Tanaka (10) Patent No.: US 8,406,262 B2
(45) Date of Patent: Mar. 26, 2013

(54) LD-DRIVER IMPROVING FALLING EDGE OF DRIVING SIGNAL

(75) Inventor: Keiji Tanaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 243 days.

(21) Appl. No.: 12/984,219

(22) Filed: Jan. 4, 2011

(65) Prior Publication Data

US 2011/0164636 A1 Jul. 7, 2011

(30) Foreign Application Priority Data

Jan. 6, 2010 (JP) ................................. 2010-001329

(51) Int. Cl.
*H01S 5/06* (2006.01)
*H01S 5/068* (2006.01)
(52) U.S. Cl. ..................................... 372/38.02; 323/299
(58) Field of Classification Search ............... 372/38.02; 323/299
See application file for complete search history.

(56) References Cited

U.S. PATENT DOCUMENTS

| 7,057,459 B2 | 6/2006 | Ueno |
| 7,145,928 B1 | 12/2006 | Maxim et al. |
| 2003/0086455 A1* | 5/2003 | Ciubotaru et al. ......... 372/38.02 |

FOREIGN PATENT DOCUMENTS

JP 2-23720 1/1990

\* cited by examiner

*Primary Examiner* — Jessica Stultz
*Assistant Examiner* — Michael Carter
(74) *Attorney, Agent, or Firm* — Smith, Gambrell & Russell, LLP (57) ABSTRACT

An LD driver is disclosed, which improves the rising and falling times of the driving current for the LD. The LD driver includes an inverting amplifier, an emitter follower connected in down stream of the inverting amplifier, a driving transistor driven by the emitter follower, and a current-mirror circuit connected in series to the inverting amplifier. The mirror current generated from the current flowing in the inverting amplifier is provided to the output of the emitter follower served for discharging the input capacitance of the driving transistor.

26 Claims, 12 Drawing Sheets

LD-DRIVER IMPROVING FALLING EDGE OF DRIVING SIGNAL

BACKGROUND OF THE INVENTION

1. Field of the Invention

The present invention relates to a high-speed driver circuit for a semiconductor laser diode (hereinafter denoted as LD), in particular.

2. Related Background Art

Figure 11:
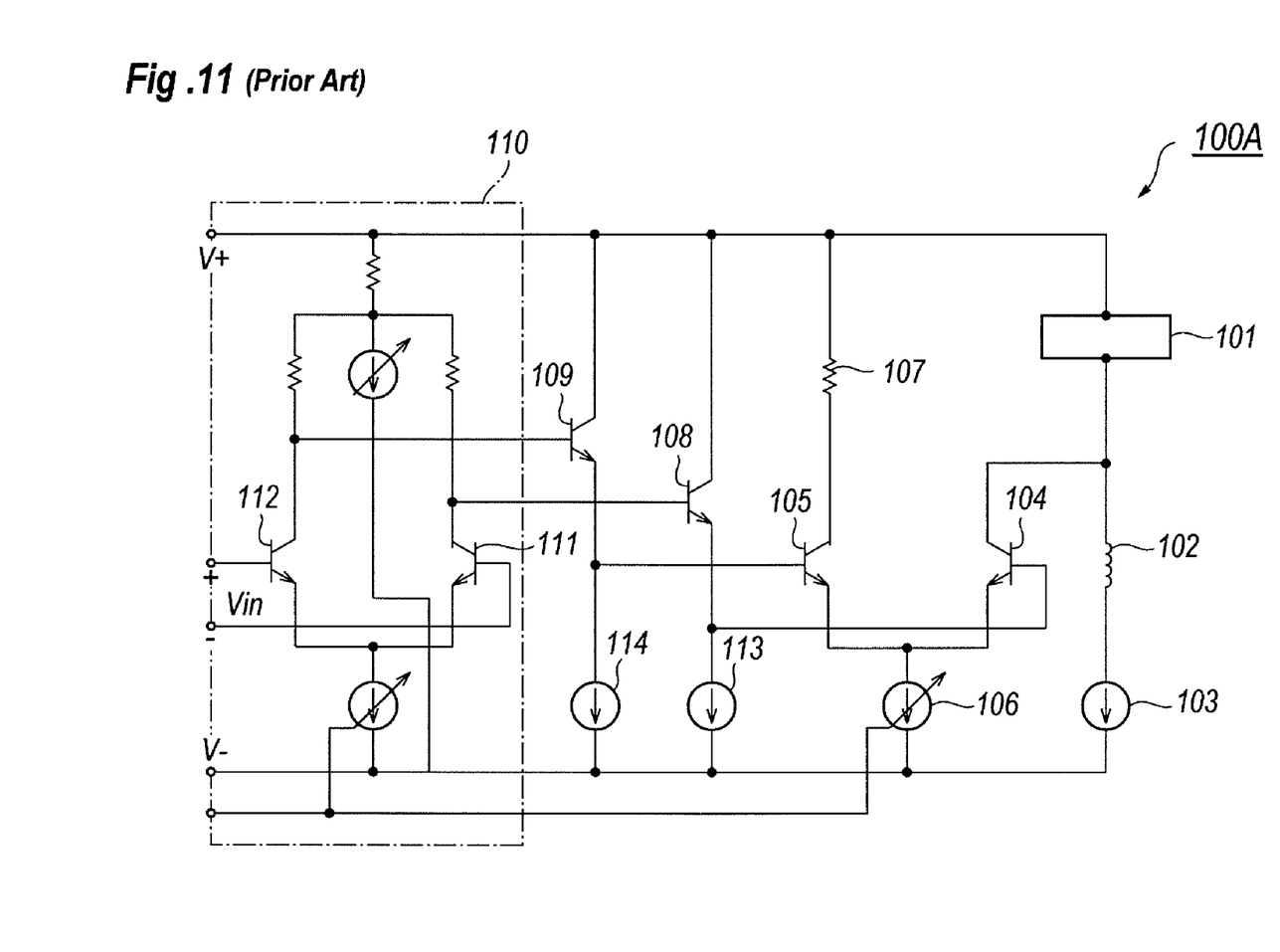
FIG. 11 is a circuit diagram of a conventional LD driver.

FIG. 11 shows a convention LD driver circuit disclosed in the U.S. Pat. No. 7,145,928. The LD driver 100A shown in FIG. 11, which summarizes primary portions of the circuit disclosed therein, comprises a bias current source including a series circuit of an inductor 102 and a current source 103; and a modulation current source including a paired transistor, 104 and 105, with another current source 106. One of the paired transistors 104 is connected to the LD 101, while, the other 105 is connected to a dummy resistor 107. Respective emitters of the paired transistor are commonly connected to the current source 106.

The paired transistor, 104 and 105, receives a driving signal, which may be a differential signal, from the emitter followers. Each of emitter followers includes a series circuit of a transistor, 108 or 109, and a current source, 113 or 114, connected between two power supplies, V+ and V−. The LD driver 100A further provides a pre-driver circuit 110 in the front stage of the emitter followers. The pre-driver 110 includes a differential circuit of two transistors, 111 and 112. The input signal Vin with a complementary configuration is provided to the base of respective transistors, 111 and 112.

Another U.S. Pat. No. 7,057,459, has disclosed an integrated circuit implemented in, for instance, an operational amplifier. The circuit disclosed therein improves the slew rate by driving the output stage in push-pull mode by a complementary signal. A Japanese Patent Application published as JP-H02-023720A, has disclosed an integrated circuit using MESFETs which also improves the slew rate by providing a pulse signal to a transistor constituting the current source in the source follower stage. The pulse signal is generated by differentiating the input signal with a capacitor and has an opposite phase to that of the input signal. Then the current source may increase the current thereof only during the transition of the input signal.

When the LD 101 driven by the circuit 100A is necessary to be provided with a large modulation current, the paired transistor, 104 and 105, inevitably widens the size thereof, which is directly reflected to the increase of the input capacitor Cbe of the transistor, 104 and 105. In order to accelerate the slew rate of the circuit 100A, it is necessary to discharge the input capacitance as fast as possible. Conventionally, the emitter follower stage, 108 and 109, is put between the pre-driver circuit 110 and the paired transistor, 104 and 105, to reduce the output impedance of the pre-driver circuit 110. However, further reduction of the impedance requires the increase of the current, 113 and 114, flowing in the emitter follower, which results in the increase of the power consumption.

Moreover, the charging of the input capacitor Cbe may be carried out through the transistors, 108 and 109, in the driving mode depending on the input signal Vin, but the discharging is done only by the current source with a constant rate independent of the input signal Vin. Thus, the discharging of the input capacitor Cbe takes a longer period compared to the charging. In order to accelerate the discharging time, the current source, 113 and 114, is necessary to be further enlarged.

Figure 12:
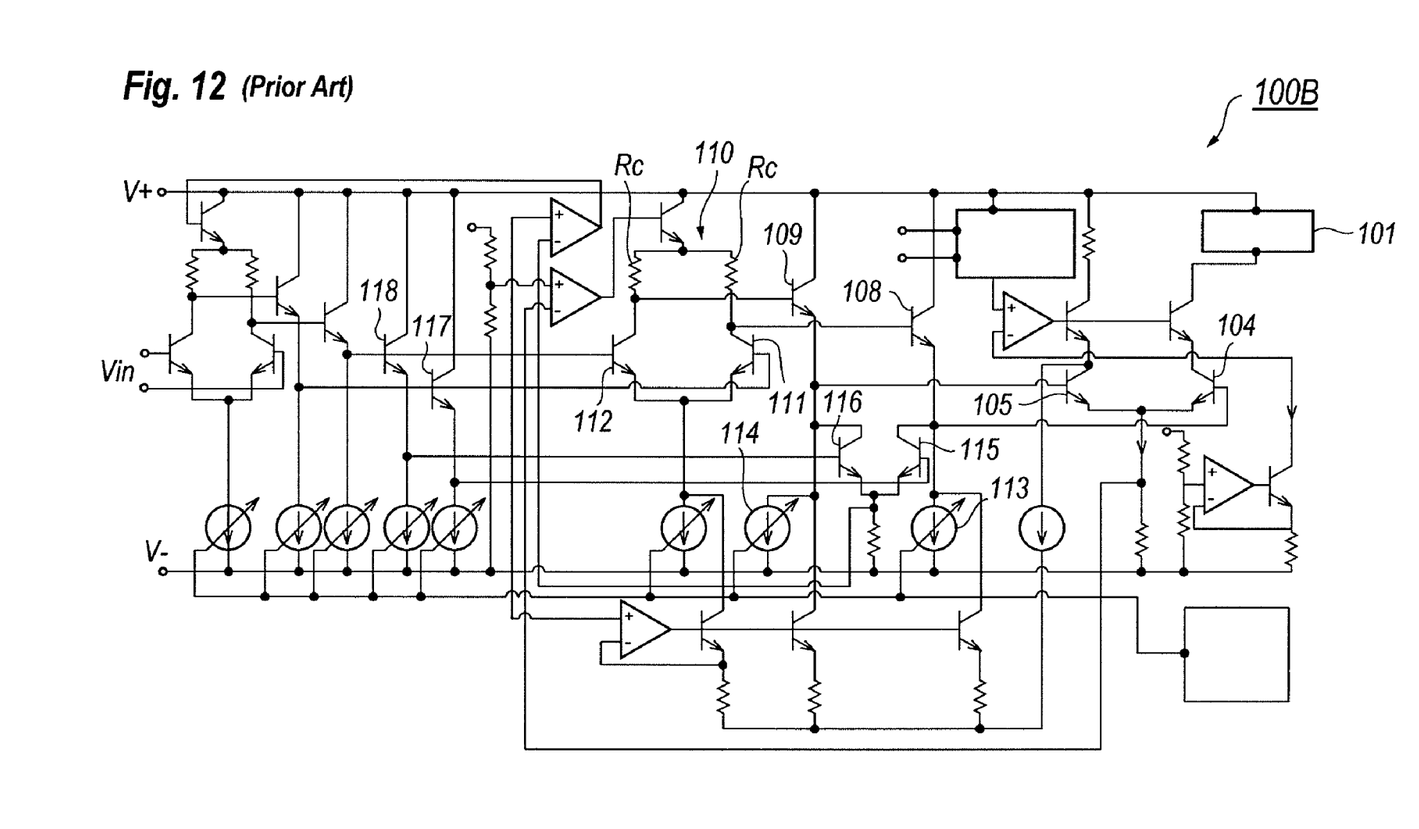
FIG. 12 is a circuit diagram of another conventional LD driver.

FIG. 12 shows another conventional LD driver circuit 100E disclosed in the prior United States patent above described, U.S. Pat. No. 7,145,928. The circuit 100B provides, in addition to the driver circuit 100A shown in FIG. 11, a paired transistors, 115 and 116, in the emitter follower stage so as to be a variable current source driven by the input signal Vin but with a phase opposite to the signal provided to the pre-driver circuit 110.

Transistors, 108 and 115, and transistors, 109 and 116, each constitutes a push-pull circuit because the signal provided for the upper transistors, 108 and 109, and that provided for the lower transistors, 115 and 116, have an opposite phase to each other. However, because the upper transistors, 108 and 109, are driven by the pre-driver circuit 110, while, the lower transistors, 115 and 116, are driven directly by the input signal, which causes a delay by the pre-driver circuit 110 in the single provided for the upper transistors, 108 and 109. Accordingly, the lower transistors, 115 and 116, receive the input signal Vin through other emitter followers including transistors, 117 and 118. Thus, in the LD driver 100B shown in FIG. 12, the power consumption thereof increases and the layout connecting two emitter followers becomes complex. Moreover, the delay in the pre-driver 110 depends on the load resistor Rc, while, that in the emitter follower inherently depends only on the transistors, 117 and 117, which makes it complex to adjust the delay between the upper and lower transistors.

SUMMARY OF THE INVENTION

An aspect of the present invention is, in an LD driver circuit including a push-pull driver for driving the output transistor, to reduce a time lag between the push driver and the pull driver as suppressing the increase of the power consumption of the push-pull driver. The LD driver according to the present invention comprises an inverting amplifier, an emitter follower, a current-mirror circuit, and an output transistor. The inverting amplifier receives an input signal and outputs an amplified signal. The emitter follower includes a buffer transistor and a current source connected in series to the buffer transistor. The buffer transistor with the emitter follower connection receives the amplified signal and outputs a driving signal in the emitter thereof. The output transistor receives the driving signal and drives the LD. The current-mirror circuit, which is connected in series to the inverting amplifier, reflects a current flowing in the inverting amplifier to a mirror current that pulls out carriers accumulated in the input capacitance of the output transistor. The buffer transistor in the emitter follower and a mirror transistor that provides the mirror current constitute the push-pull circuit for driving the output transistor.

Setting the input signal in LOW level, the inverting amplifier turns off to cut the current flowing therein and the amplified signal turns in HIGH level. Receiving the amplified signal in HIGH level, the buffer transistor outputs the driving signal in HIGH level to the output circuit. The input capacitor of the output circuit may be charged by the buffer transistor and the rising time of the driving signal may be accelerated. Because the inverting amplifier turns off, the current mirror-circuit generates no mirror current during the input signal stays in LOW level.

While, setting the input signal in HIGH level, the amplified signal turns LOW level to flow a current therein, but the current-mirror circuit connected in series to the inverting amplifier may reflect the current flowing in the inverting amplifier to the mirror transistor. The charges accumulated in the input capacitor of the output circuit may be discharged by this mirror current, which accelerates the falling edge of the driving signal. Thus, the LD driver according to the present invention may accelerate the falling edge of the driving signal, namely, the driving signal of the output circuit, without increasing the current determined by the current source in the emitter follower. The mirror current may be generated only for a period when the input signal stays in HIGH level, which may suppress the increase of the power consumption.

The LD driver of the present invention may reduce the time lag between the signal path from the input to the input of the output circuit through the emitter follower and another path through the current-mirror circuit; because the former path includes two transistors, one is in the inverting amplifier and the other is in the emitter follower, while, the latter path includes also two transistors, one is in the inverting amplifier and the other is in the current mirror. Thus, the LD driver of the invention may suppress the time lag between the push driver and the pull driver, which simplifies the circuit layout.

The LD driver of the present invention may provide a configuration of the differential circuit, that is, the inverting amplifier comprises a pair of amplifiers each receiving a input signal complementary to the other, the emitter follower comprises paired units each receiving respective amplified signals from the inverting amplifier and outputs a pair of driving signals also complementary to the others, an output circuit with the differential circuit each receiving respective driving signals, and the current-mirror circuit also includes paired units each connected in series to respective inverting amplifiers and reflects the current flowing in the inverting amplifier to the mirror current for providing one of the transistors in the differential circuit in the output circuit. The LD may be connected between the outputs of the differential circuit and is driven in the differential mode.

In an modification of the LD driver according to the present invention, the mirror transistor may be driven by a spiked signal synchronized with one of the amplified signal and the driving signal, both of which have the same phase. The mirror transistor driven by the spiked signal may generate a spiked current synchronized with the falling edge of the driving signal. The spiked current may further accelerate the discharging of the carriers accumulated in the input capacitor Cbe of the output circuit. In this modification, the mirror ratio of the current-mirror circuit may be less than unity, which means that a lesser mirror current flows in a stable state and a spiked large current may be provided only at the falling edge of the driving signal.

BRIEF DESCRIPTION OF DRAWINGS

The foregoing and other purposes, aspects and advantages will be better understood from the following detailed description of a preferred embodiment of the invention with reference to the drawings, in which:

FIG. 4A is an eye-diagram of the outputs of the LD driver according to the present invention, while.

FIG. 5A shows the response of the driving signal obtained in the conventional LD driver, while.

FIG. 6A shows the response of the base input current in the conventional LD driver, while.

FIG. 7A shows the response of the emitter current and the base input current appeared in the conventional LD driver; while.

DETAILED DESCRIPTION OF PREFERRED EMBODIMENTS

Next, some preferred embodiments of an LD driver according to the present invention will be described as referring to accompanying drawings. In the description of the drawings, the same or like numerals or the symbols will refer to the same or like elements without overlapping explanations. Although the specification concentrates on bipolar transistors with a base as the control electrode, and an emitter and a collector as the current electrode, the active devices used in the circuit may be the FET with a gate as the control electrode, and a drain and a source as the current electrode.

Figure 1:
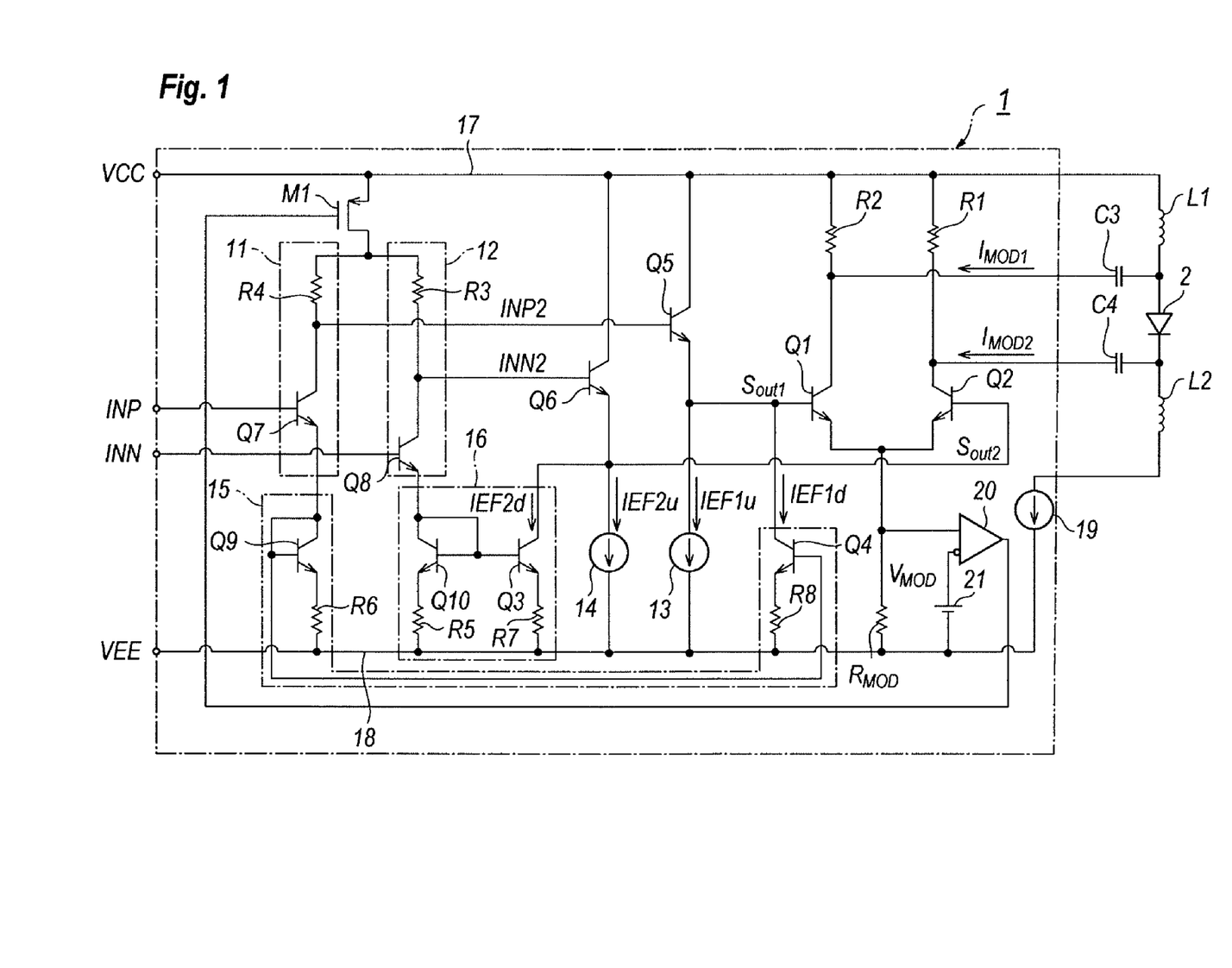
FIG. 1 is a circuit diagram of the LD driver according to an embodiment of the present invention.

FIG. 1 is a circuit diagram of an LD-Driver according to an embodiment of the present invention. The LD-Driver 1 generates a differential current, $I_{MOD1}$ and $I_{MOD2}$ to drive the LD 2. The LD driver 1 comprises the first and second control units.

The first control unit provides the driving signal $S_{OUT1}$ to the transistor Q1 in the output circuit by receiving the input signal INP with a positive phase, while, the other unit provides the other driving signal $S_{OUT2}$ to the transistor Q2 by receiving the input signal INN with a negative phase. The inputs, INP and INN, are complementary to each other with a speed of 10 Gbps or faster and have a magnitude greater than 400 mV in peak-to-peak.

The first control unit comprises an inverting amplifier 11 including the transistor Q7 (as the first transistor), an emitter follower including the transistor Q5 (as the second transistor) and a current source 13 including another transistor (as the third transistor but not shown in FIG. 1), and a current-mirror circuit 15. The second control unit comprises the inverting amplifier 12 including the transistor Q8 (as the first transistor), the emitter follower including the transistor Q6 (as the second transistor) and the current source 14 including another transistor (as the third transistor but not shown in FIG. 1), and the current-mirror circuit 16.

The inverting amplifier 11 in the first control unit inversely amplifies the input INP, and comprises the transistor Q7 and the resistor R4 connected to the collector of the transistor Q7 as a load resistor. One of terminals of the resistor R4 receives the positive power supply 17 (VCC) through a PMOS-FET M1. The emitter of the transistor Q7 is coupled to the negative power supply 18 (VEE) through the current-mirror circuit 15.

Thus, the inverting amplifier 11 constitutes the emitter grounded amplifier and has the voltage gain A1 as follows:

$$A1 = R4/(1/gm7 + 1/gm9 + R6) \quad (1),$$

where gm7 and gm9 are the trans-conductance of the transistors, Q7 and Q9, respectively. The inverting amplifier 11 provides an amplified signal INP2 to the buffer transistor Q5 in the emitter follower. The LD-Driver 1 may set the positive power supply VCC to be 3 V, while, the negative power supply VEE to be 0 V, that is the ground.

The second control unit inversely amplifies the input INN provided to the base of the transistor Q8. The inverse amplifier 12 includes the transistor Q8 and the load resistor R3 that is coupled to the positive power supply 17 through the p-MOSFET M1. The emitter of the transistor Q8 is coupled the negative power supply 18 through the current-mirror circuit 16. Thus, the arrangement of the second control unit is equivalent to those of the first control unit, and the voltage gain A2 thereof is given by:

$$A2 = R3/(1/gm8 + 1/gm10 + R5) \quad (2),$$

where gm8 and gm10 are the trans-conductance of the transistors, Q8 and Q10, respectively. The inverting amplifier 12 provides the voltage signal INN2 to the base of the buffer transistor Q6.

The buffer transistor Q5 receives the amplified signal INP2, which is the output of the inverting amplifier 11, in the base thereof; while the emitter of the buffer transistor Q5 coupled to one of the paired transistor Q1 and to the negative power supply VEE through the current source 13. Thus, the transistor Q5 constitutes the emitter follower circuit to provide the driving signal $S_{OUT1}$ to the base of the transistor Q1.

Similarly, the other buffer transistor Q6 receives the amplified signal INN2 from the inverting amplifier 12 and transfer this signal to the base of the transistor Q2 as the driving signal $S_{OUT2}$ from the emitter thereof. The buffer transistor Q7 couples to the positive power supply 17 in the collector thereof, while, the emitter is grounded through the current source 14. Thus, the buffer transistor Q7 constitutes an emitter follower. Two buffer transistors, Q5 and Q6, operate as the push transistor in the present LD driver 1.

The current source 13 in the first control unit, put between the emitter of the buffer transistor Q5 and the ground 18, may include the third transistor and a resistor (not shown in FIG. 1). The other current source 14 in the second control unit may also include a transistor and a resistor (not shown in FIG. 1). Setting the base bias current of these transistors in the current sources, 13 and 14, the magnitude of the current, IEF1u and IEF2u, may be determined.

The current-mirror circuit 15 in the first control unit includes the source transistor Q9 connected in series to the emitter of the transistor Q7 in the inverting amplifier 11 as the diode-connection mode, where the collector and the base of the source transistor are short-circuited, a resistor R6 put between the transistor Q9 and the ground, the mirror transistor Q4 connected in parallel to the current source 13, and another resistor R8 put between the mirror transistor Q4 and the ground. The bases of two transistors, Q4 and Q9, are commonly connected, where the configuration of the transistors, Q4 and Q9, is called as the symmetrical connection. The current-mirror circuit 15 reflects the current flowing in the transistor Q7, which is the source current, to the current IEF1d flowing in the transistor Q4 as the mirror current.

The operation of the current-mirror circuit 15 will be further described. Generally, the current mirror circuit reflects a current flowing in one transistor whose base and collector are short-circuited to another current flowing in the other transistor but the magnitude of the reflected current, which is often called as the mirror current, depends on respective sizes of two transistors. Referring to FIG. 1, the current-mirror circuit 15 in the first control unit provides two transistors, Q4 and Q9, the latter of which has the configuration of the diode connection where the base and collector thereof are short-circuited. Then, the current flowing in the transistor Q9, which is substantially equal to the current flowing in the inverting amplifier 11 may be reflected to the current IEF1d flowing in the transistor Q4.

When the input INP is in HIGH level, which increases the current flowing in the transistor Q7, this increase may be reflected in the increase of the current IEF1d flowing in the transistor Q4. On the other hand, the input INP may be reflected in the level of the emitter of the buffer transistor Q5 in opposite phase, because the input INP is amplified by the inverting amplifier 11. Accordingly, when the input INP becomes HIGH, the level of the driving signal $S_{OUT1}$ of the driving transistor Q1 decreases but the current flowing in the buffer transistor Q5 increases by the mirror current IEF1d.

When the input INP is in LOW level, which decreases or substantially cuts the source current flowing in the transistor Q9, the emitter level of the buffer transistor Q5 increases but the current flowing therein decreases due to the decrease of the mirror current IEF1d. Thus, the mirror transistor, Q4 and Q3, operates as the pull transistor.

The second control unit operates in a similar manner described above. That is, when the input INN is in HIGH level, the emitter voltage of the buffer transistor Q6 decreases but the current flowing there increases by the increase of the mirror current IEF2d. On the other hand, when the input INN is in LOW level, then the emitter voltage of the buffer transistor Q6 increases but the current flowing there decreases by the decrease of the mirror current IEF2d.

The transistors, Q1 and Q2, of the present embodiment configure the differential circuit accompanied with resistors, R1, R2 and $R_{MOD}$. The collector of one of the transistor Q1 is coupled with the positive power supply 17 through the resistor R2, while, the collector of the other transistor Q2 is coupled thereto through the other resistor R1. Two emitters are commonly grounded through the resistor $R_{MOD}$. The LD 2 is AC-coupled between the collectors of the transistors, Q1 and Q2, through respective coupling capacitors, C3 and C4. The output circuit shown in FIG. 1 generates currents, $I_{MOD1}$ and $I_{MOD2}$, complementary to the other by receiving the driving signals, $S_{OUT1}$ and $S_{OUT2}$, with the differential mode. Two resistors, R1 and R2, may operate as the back-termination resistor to suppress the multiple reflections by absorbing a signal heading to the transistor reflected by the LD 2. The last resistor $R_{MOD}$ may determine the magnitude of the modulation currents, $I_{MOD1}$ and $I_{MOD2}$. Two capacitors, C1 and C2, may cut the DC component of the current, $I_{MOD1}$ and $I_{MOD2}$, which enables the transistors, Q1 and Q2, and the LD 2 to be biased separately, that is, two transistors, Q1 and Q2, are electrically isolated from the LD 2 in the DC mode.

The LD 2 in the anode thereof is coupled to the positive power supply 17 through the inductor L1, while, the cathode thereof is coupled to the bias current source 19 through the other inductor L2. In this arrangement of the LD 2, the bias current which is the DC current may be provided to the LD 2 through two inductors, L1 and L2, independent of the modulation current because of two inter-stage capacitors, C3 and C4. The bias current source 19, which is set in the side of the negative power supply 18, may be arranged in the side of the positive power supply 17. In this case, the second inductor L2 may be directly grounded. Although the arrangement shown in FIG. 1 assumes that the LD 2 is driven by the differential mode, the LD 2 may be driven in the mono-phase mode. Moreover, setting the bias conditions of the LD 2 and the driving transistors, Q1 and Q2, two inter-stage capacitors, C3 and C4, may be removed.

The LD driver 1 may further provide a feedback circuit that feeds the magnitude of the modulation currents, $I_{MOD1}$ and $I_{MOD2}$, back to the current flowing in the front end. That is, the feedback circuit comprises an operational amplifier 20, a voltage source to set the reference signal $V_{MOD}$ that defines the magnitude of the modulation current, $I_{MOD1}$ and $I_{MOD2}$, and the p-MOSFET M1. The operational amplifier 20 receives the reference signal $V_{MOD}$ in the inverting input thereof and its output is fed to the gate of the p-MOSFET M1. The p-MOSFET M1 is connected between the resistors, R3 and R4, and the positive power supply 17.

The operational amplifier 20 senses the voltage generated in the reference resistor $R_{MOD}$ by the modulation current, $I_{MOD1}$ or $I_{MOD2}$ and outputs a gate signal for the p-MOSFET M1 such that the sensed voltage becomes equal to the reference signal $V_{MOD}$, which is equivalent to the operation that the operational amplifier 20 controls the p-MOSFET M1 such that the modulation current, $I_{MOD1}$ or $I_{MOD2}$, becomes equal to a target magnitude defined by $V_{MOD}/R_{MOD}$ by adjusting the current flowing in the transistors, Q7 and Q8.

Specifically, the operational amplifier 20 operates such that two inputs thereof become substantially equal to the others. That is, when the modulation current, $I_{MOD1}$ or $I_{MOD2}$, increases, the output of the operational amplifier increases, which decreases the current flowing in the p-MOSFET while increases the average voltage of the amplified signal, INP2 and INN2. Accordingly, the common emitter voltage of transistors, Q1 and Q2, rises. Thus, the modulation current, $I_{MOD1}$ or $I_{MOD2}$ becomes stable in a value determined by $V_{MOD}/R_{MOD}$.

Next, the operation of the LD driver 1 will be described in detail. Providing the input INP in the LOW level to the transistor Q7, the output of the inverting amplifier 11 becomes HIGH level which is led to the base of the transistor Q1 through the buffer transistor Q5. During the transition from LOW level to HIGH level in the output of the buffer transistor Q5, namely, the driving signal $S_{OUT1}$, the buffer transistor Q5 may charge the input capacitor Cbe of the transistor Q1. Because the buffer transistor Q5 in the base to the emitter is positively biased, an enough charges may be supplied from the buffer transistor Q5, which may accelerate the rising edge of the driving signal $S_{OUT1}$.

On the other hand, when the base of the transistor Q7 receives HIGH level, the amplified signal INP2 of the inverting amplifier 11 falls to LOW level, which is led to the base of the transistor Q1 through the buffer transistor Q5 and turns the transistor Q1 off. But the transistor Q7 is left in ON state where a substantial current flows in the transistor Q7. This substantial current flowing in the transistor Q7 is reflected to the mirror current IEF1$d$ by the current-mirror circuit 15. Thus, the mirror current IEF1$d$ is modulated in synchronous with the input INP; that is, when the input INP becomes HIGH, the mirror current IEF1$d$ increases; while, the input INP is in LOW, the mirror current IEF1$d$ decrease or is substantially cut. The increased mirror current IEF1$d$ may discharge the input capacitor Cbe of the transistor Q1 even the buffer transistor Q5 and the current source 13 are restricted to discharge the input capacitor Cbe, which may accelerate the falling edge of the driving signal $S_{OUT1}$. During the transition from LOW to HIGH in the driving signal $S_{OUT1}$, the transistor Q5 in the emitter follower may charge the input capacitor Cbe as described.

Thus, the LD driver 1 according to the present embodiment may accelerate the falling edge of the driving signal $S_{OUT1}$ of the transistor Q1 without enlarging the size of the emitter follower, Q5 and 13. The explanation above concentrates on the circuit corresponds to the input with the positive phase, that is, the signal path from the input INP, the transistor Q7, the amplified signal INP2, the emitter follower Q5 and 13, the driving signal $S_{OUT1}$, the transistor Q1 and the current-mirror circuit 15; but the same explanation may be applicable for the signal path from the input INN to the other transistor Q2 with the current-mirror circuit 16.

Figure 2A:
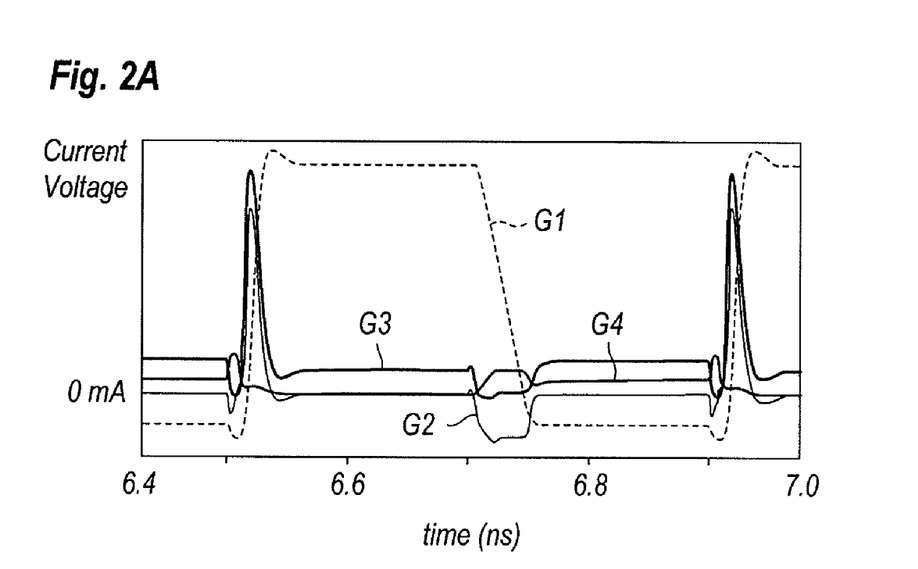
FIGS. 2A and 2B show response of the current and the voltage appeared in the LD driver of the present invention, where FIG. 2A corresponds to a condition where the mirror ratio is set to be unity, while, FIG. 2B corresponds to the mirror ratio of double.
Figure 2B:
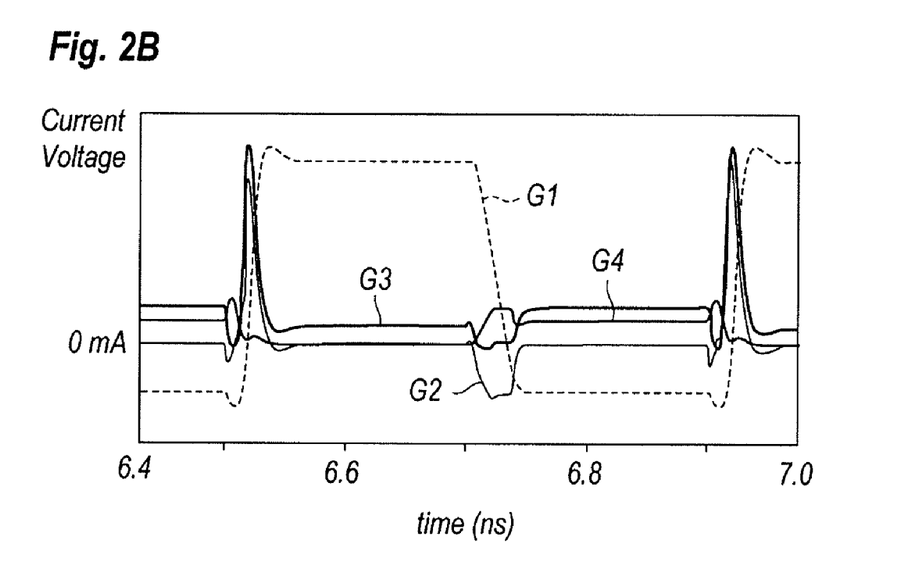
Figure 3:
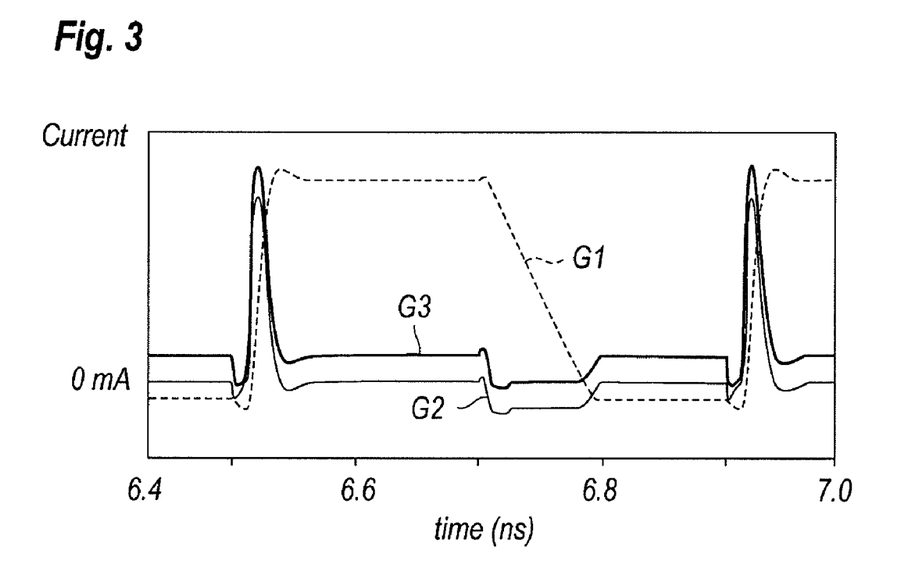
FIG. 3 shows responses of the current and the voltage in a conventional LD driver without the current-mirror circuit.

FIGS. 2A and 2B evaluate the response of the LD driver 1 according to the present embodiment, where FIG. 2A assumes that the mirror ratio, which is a ratio of the mirror current to the source current in the current-mirror circuit, is unity; while, FIG. 2B shows a result where the mirror ratio is double. FIG. 3 shows a result for a conventional LD driver where the current mirror circuits, 15 and 16, are omitted. In these figures, symbols G1 to G4 correspond to behaviors of the driving signal, $S_{OUT1}$ and $S_{OUT2}$, the base input current of the transistors, Q1 and Q2, the emitter current of the buffer transistor, Q5 and Q6, and the mirror current, IEF1$d$ and IEF2$d$, respectively.

Referring to FIG. 3 for the conventional LD driver, the driving signal G1 shows a steep rising edge but almost linear and moderate falling edge because the input capacitor Cbe of the transistors, Q1 and Q2, may be discharged only through the current source, 13 and 14, in the emitter follower. The behavior G2 becomes negating in the falling edge of the behavior G1, which means that the input capacitor Cbe of the load transistors, Q1 and Q2, is discharged.

Referring to FIGS. 2A and 2B, the falling edge of the driving signal G1 becomes faster compared to that shown in FIG. 3, because the LD driver 1 of the present embodiment provides, in addition to the current source, 13 and 14, the mirror current, IEF1$d$ and IEF2$d$, to discharge the input capacitor Cbe. The mirror ratio in FIG. 2A is set to be unity, the discharging time of the input capacitor Cbe may be reduced to about half of that shown in FIG. 3. While, FIG. 2B corresponds to a case where the mirror ratio is set to be double, the falling edge of the driving signal G1 may be further shortened.

A positive spike in the emitter current G3 of the buffer transistor, Q5 and Q6, appeared in the rising edge of the driving signal G1 means that a transitional current flows therein to charge the input capacitor Cbe. While, the emitter current G3 becomes substantially zero in the falling edge of the driving signal G1, which means that the current set by the current source, 13 and 14, in almost whole portion thereof is served for discharging the input capacitor Cbe.

Figure 4A:
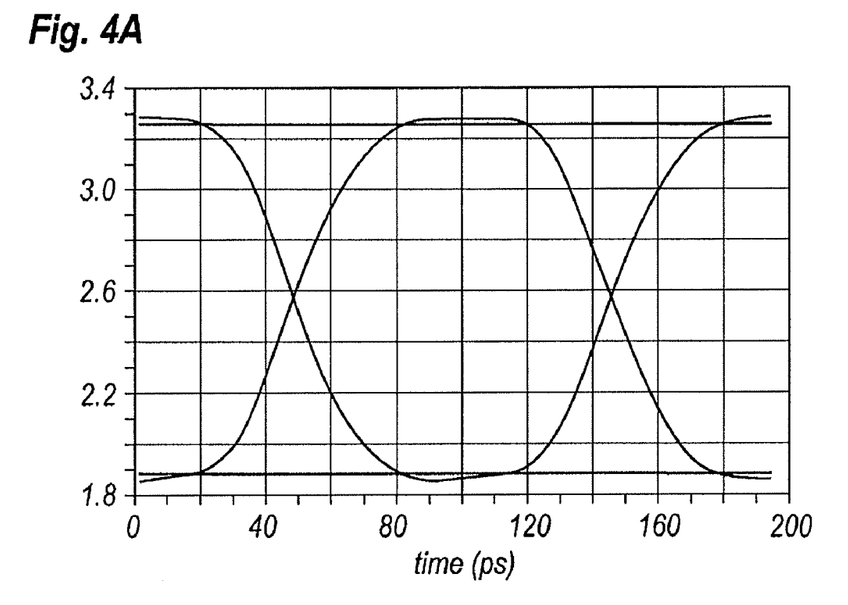
Figure 4B:
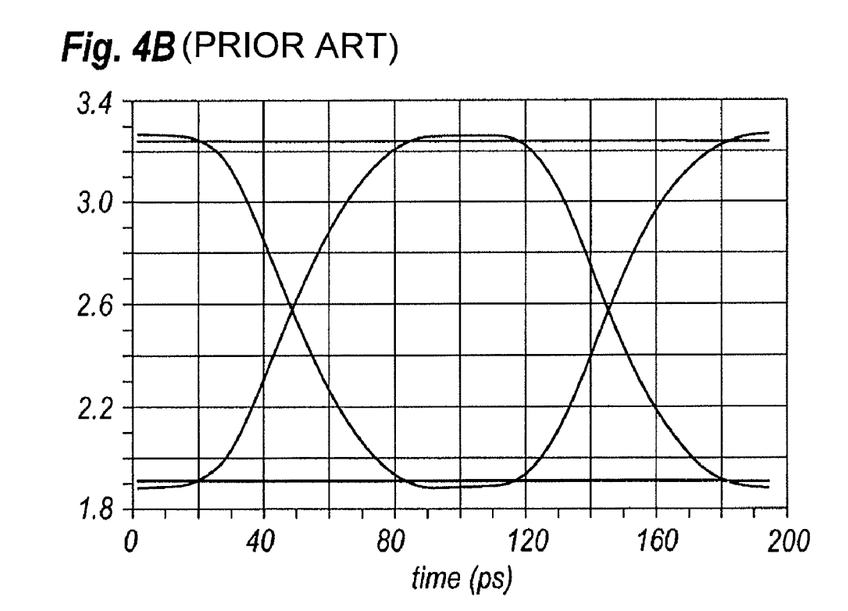
FIG. 4B is an eye diagram obtained in a conventional LD driver.

FIG. 4A is an eye diagram of the output signal obtained by the LD driver 1 according to the present embodiment, while, FIG. 4B is those for a conventional LD driver without the current-mirror circuit. During the simulation for FIGS. 4A and 4B, a differential load with resistance of 100Ω is connected between two differential outputs substituting for the LD 2; and the coupling capacitors, C3 and C4, and two bias inductors, L1 and L2, are omitted. The current flowing in the emitter follower is set to be 10 mA and the modulation current, $I_{MOD1}$ and $I_{MOD2}$, are set to be 60 mA.

FIG. 4A assumes the source current, IEF1$u$ and IEF2$u$, of the current-mirror circuit, 15 and 16, to be 2 mA, while, the mirror current, IEF1$d$ and IEF2$d$, to be 3 mA. The rising and falling time of the outputs shown in FIG. 4A are obtained to be 26.5 and 25.5 ps, respectively. While, FIG. 4B assumes that the current flowing in the front stage transistor, Q7 and Q8, is 5 mA and the mirror current is 0 mA. The rising and falling time in FIG. 4B become 29.0 and 28.1 ps, respectively. In these evaluations, the signal with a speed of 10 Gbps is assumed. The results in FIG. 4B are inferior by about 3 ps compared to the results in FIG. 4A. Thus, the LD driver 1 according to the present embodiment may save the power consumption to obtain the rising and falling edges of the output thereof comparative to those of the conventional LD driver, or, when the power consumption comparative to that of the conventional LD driver, the rising and falling edges thereof may be shortened.

Almost no time lag may occur between a signal provided from the buffer transistor Q5 reflected in the driving signal $S_{OUT1}$ and a signal coming from the current mirror 15 reflected to the mirror current IEF1d, because the same number of transistors are put in the respective signal paths. Interconnections between the devices may affect the time lag; however, a length of the interconnections within the integrated circuit is quite short and almost no parasitic capacitor and inductor causing a substantial time lag are formed.

Figure 5A:
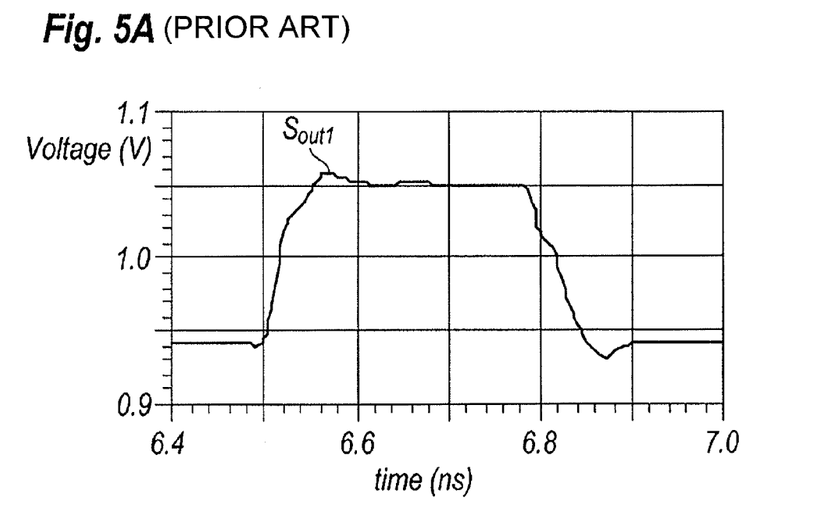
Figure 5B:
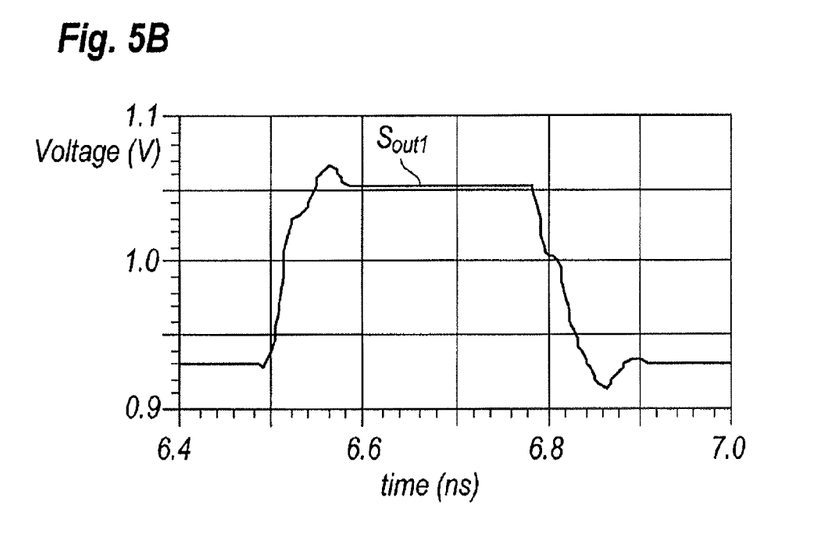
FIG. 5B shows response of the driving signal obtained in the present LD driver.
Figure 6A:
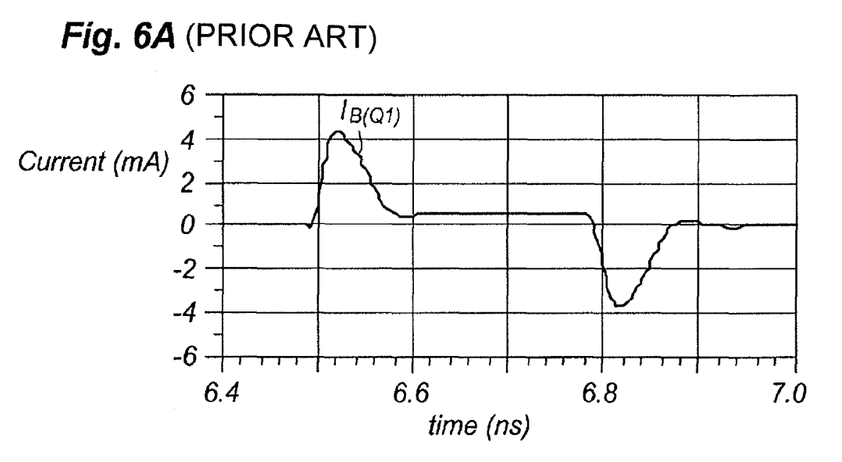
Figure 6B:
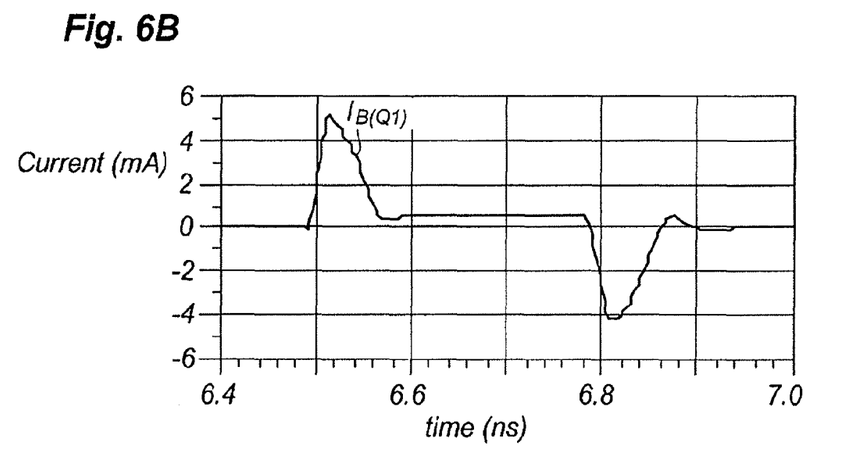
FIG. 6B is the base input current obtained in the present LD driver.
Figure 7A:
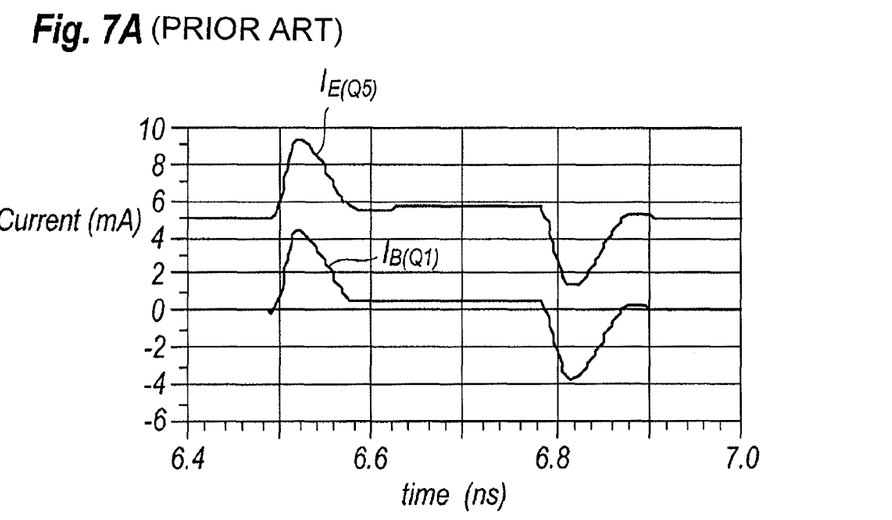
Figure 7B:
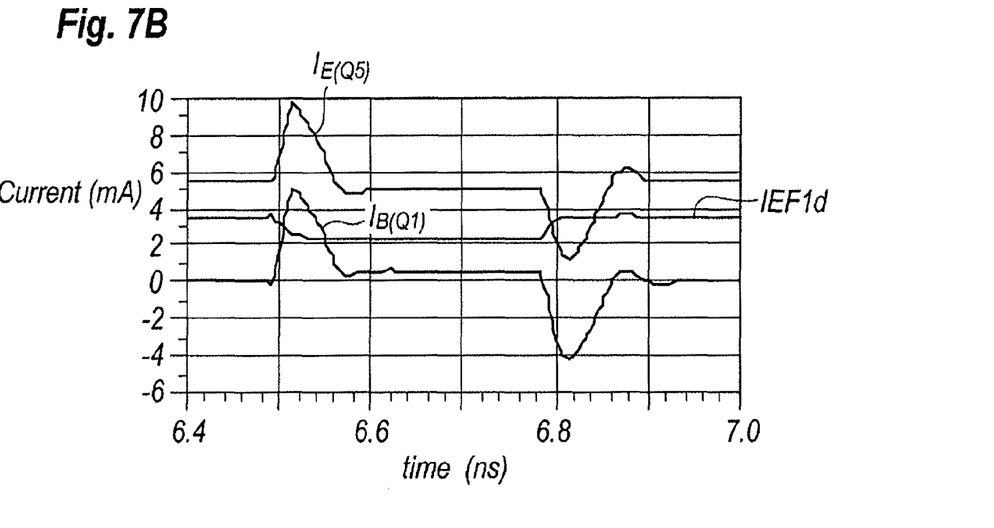
FIG. 7B shows the response of the emitter current (push current), the mirror current (pull current), and the base input current obtained in the present LD driver.

FIGS. 5 to 7 compares the signals contributing to the operation of the transistors, Q1 and Q2, where FIGS. 5A, 6A and 7A each shows behavior of the signal in the conventional LD driver without the current-mirror circuit, while FIGS. 5B, 6B and 7B correspond to those of the present embodiment. FIG. 5 shows the behavior of the driving signal, $S_{OUT1}$ and $S_{OUT2}$ FIG. 6 shows the base input current, $I_{B(Q1)}$ and $I_{B(Q2)}$; and FIG. 7 shows the current $I_{E(Q5)}$ flowing in the buffer transistor, Q5 and Q6, the base input current, $I_{B(Q1)}$ or $I_{B(Q2)}$; and the mirror current, IEF1d or IEF2d.

Synchronizing with the change of the driving signal $S_{OUT1}$ for the transistor Q1 as those shown in FIG. 5, the spiked base input current $I_{B(Q1)}$ flows therein to charge and discharge the input capacitor Cbe of the transistor Q1 as shown in FIG. 6. Referring to FIG. 7A, the a pulsed transitional current flows in the buffer transistor Q5 synchronizing with the rising edge of the driving signal $S_{OUT1}$, while a pulsed kink appears synchronizing with the falling edge of the driving signal $S_{OUT1}$.

Referring to FIGS. 5B, 6B and 7B, in the LD driver 1 according to the present embodiment, a spiked current also flows in the buffer transistor Q5 to charge and discharge the input capacitor Cbe. Referring to FIG. 7B, the spiked current is provided from the buffer transistor Q5 to charge the input capacitor Cbe synchronizing with the rising edge of the driving signal $S_{OUT1}$; while, the current $I_{E(Q5)}$ provided from the buffer transistor Q5 abruptly decreases but the mirror current IEF1d increases. Thus, the buffer transistor Q5 in the emitter follower and the mirror transistor Q3 in the current-mirror circuit 15 may complementarily operate. Accordingly, the emitter current $I_{E(Q5)}$ in an average thereof is substantially equal to that of the conventional LD driver but the current to discharge the input capacitor Cbe may increase by the mirror current IEF1d, which accelerates the falling edge of the driving signal $S_{OUT1}$ and that of the driving current $I_{MOD1}$ for the LD 2. Referring to FIGS. 6A and 6B, the spiked current of the conventional LD driver is limited to 4 mA, while, that of the present embodiment becomes 5 mA, where about 25% improvement is achieved.

The present embodiment of the LD driver 1 may provide the feedback unit that feeds the magnitude of the modulation current, $I_{MOD1}$ and $I_{MOD2}$ back to the current flowing in the input transistors, Q7 and Q8, which may keep the modulation current, $I_{MOD1}$ and $I_{MOD2}$, in constant independent of the operating temperature of the LD 2. Moreover, the optical output of the LD 2 may be kept constant by adjusting the reference $V_{MOD}$ depending on the operating temperature of the LD 2.

Figure 8:
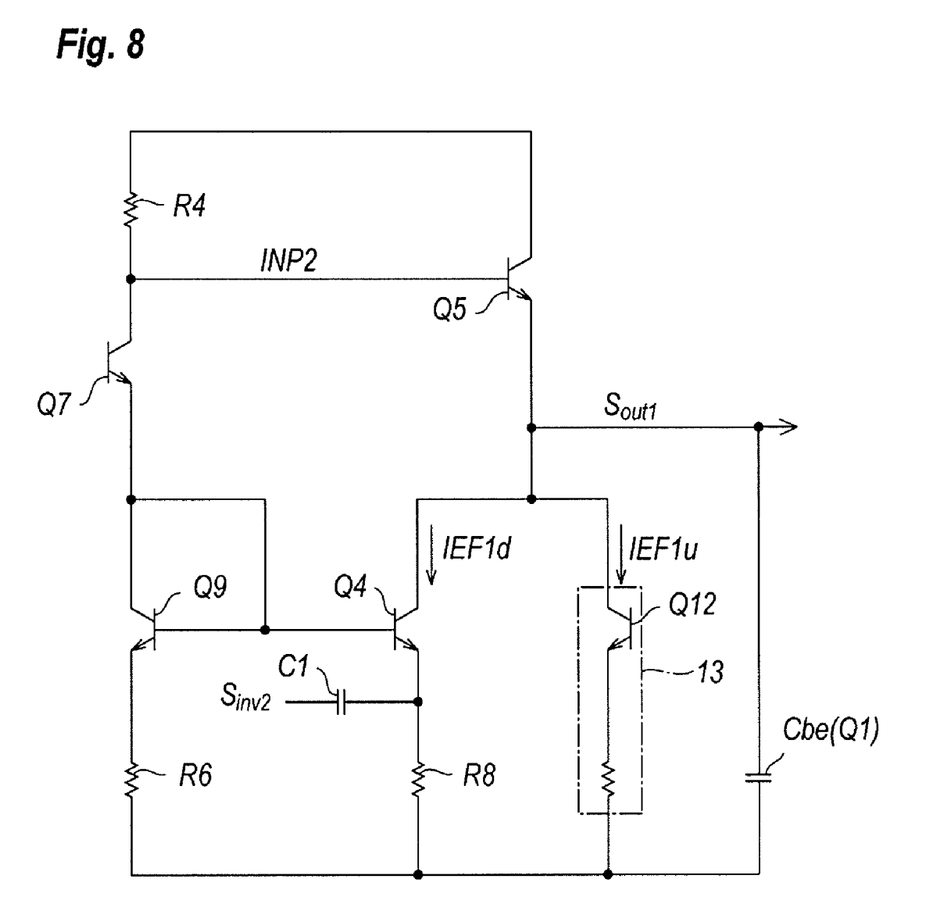
FIG. 8 shows a modification of the first control unit.

Another embodiment of an LD driver according to the present invention will be described as referring to FIGS. 8 and 9. FIG. 8 selectively shows the first control unit of the LD driver, while, FIG. 9 selectively shows the second control unit in the LD driver. Transistors, Q12 and Q13, appeared in FIGS. 12 and 13, are involved in the constant current source, 13 and 14, as the third transistor.

Figure 9:
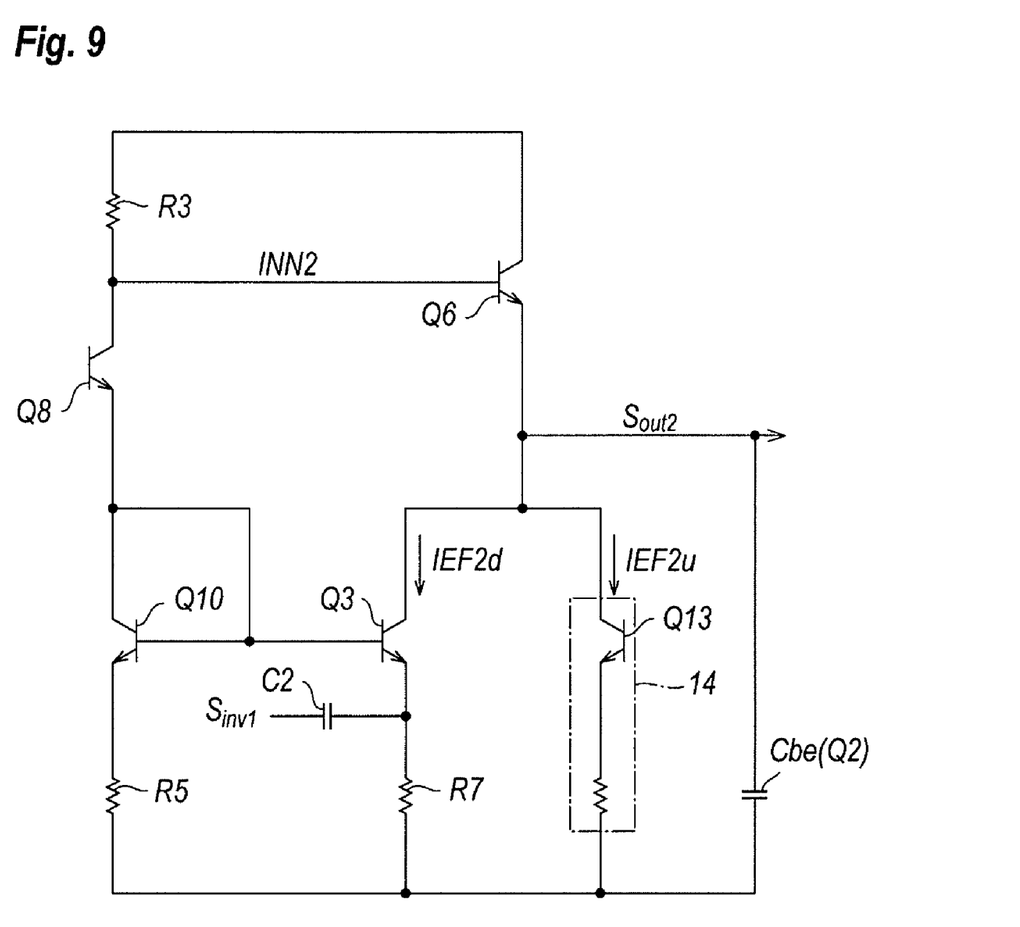
FIG. 9 shows a modification of the second control unit.

A feature of the modified embodiment shown in FIGS. 8 and 9 is that the control unit includes a capacitor, C1 or C2. That is, the emitter of the mirror transistor Q4 that generate the mirror current IEF1d receives a signal $S_{INV2}$ with a phase inverted from the driving signal $S_{OUT2}$ through the coupling capacitor C1. Similarly, the emitter of the transistor Q3 receives the signal $S_{INV1}$ whose phase is inverted from the driving signal $S_{OUT1}$.

The mirror current IEF1d generated by the mirror transistor Q4 may accelerate the transition of the transistor Q1. When the mirror current IEF1d is increased in only the falling edge of the driving signal $S_{OUT1}$ the falling edge may be further improved without increasing the steady current during LOW level of the driving signal $S_{OUT1}$. The control unit shown in FIG. 8 or 9 provides the mirror transistor, Q3 or Q4, which is driven in the emitter thereof by the signal, $S_{INV1}$ or $S_{INV2}$ with a phase opposite to the phase of counter driving signal, $S_{OUT2}$ or $S_{OUT1}$, through the capacitor, C1 or C2. The capacitors, C1 and C2, may differentiate the signals, $S_{INV2}$ and $S_{INV1}$, to convert them into a positive spiked signal synchronizing with the rising edge of the counter driving signal, $S_{OUT2}$ or $S_{OUT1}$, and a negative spiked signal synchronizing with the falling edge thereof. However, the positive spikes signal provided to the emitter may turn off the mirror transistor, Q4 or Q3, because the base-emitter bias becomes small, and only the negative spiked signal contributes the increase of the current flowing in the mirror transistor, Q4 or Q3. The capacitors, C1 and C2, may leave the mirror currents, IEF1d and IEF2d, in a substantially same level except for the falling edges of the driving signals, $S_{OUT1}$ and $S_{OUT2}$, which may suppress the increase of the power consumption of the LD driver.

Figure 10:
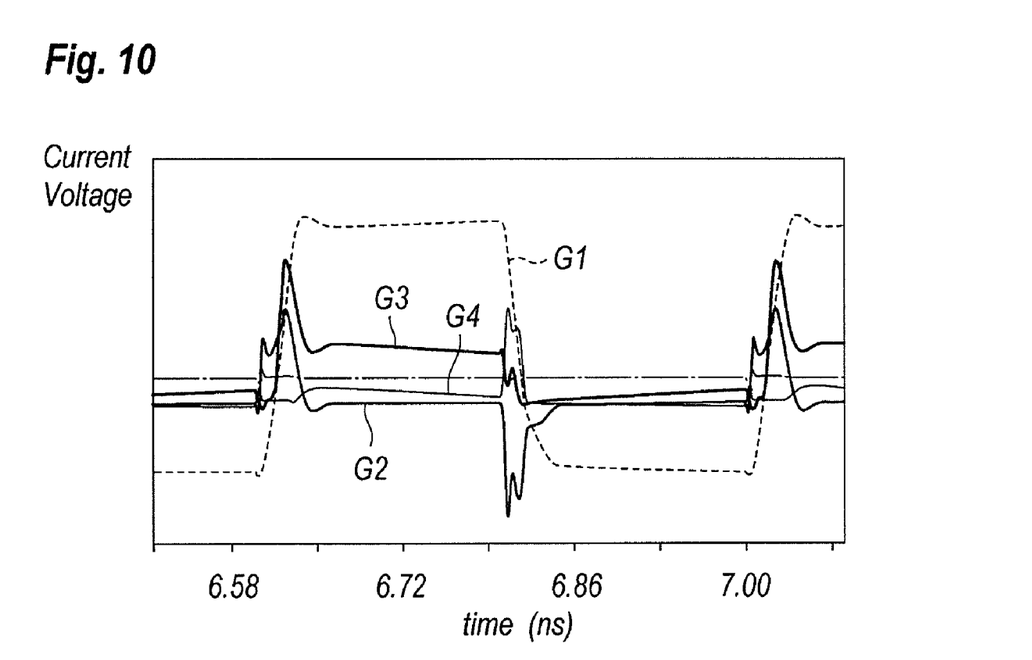
FIG. 10 shows the responses of the driving signal (G1), the base input current (G2), the emitter current (G3), and the mirror current (G4) appeared in the modified control units.

FIG. 10 shows the response of the LD driver providing the modified control units shown in FIGS. 8 and 9. FIG. 10 assumes that the mirror ratio is a quarter. In FIG. 10, G1 to G4 correspond to the driving signal $S_{OUT1}$, the base input current for the transistor Q1, the current flowing in the buffer transistor Q5 in the emitter follower, and the mirror current IEF1d flowing in the mirror transistor Q4. The coupling capacitor, C1 or C2, may differentiate the driving signal $S_{OUT1}$ and increases the current IEF1d (G4), only in the falling edge of the driving signal $S_{OUT1}$. The discharging time of the input capacitance, namely, the falling edge of the driving signal $S_{OUT1}$, may be further accelerated comparing to those shown in FIGS. 2A and 2B.

Moreover, not only the mirror current increases at the falling edge, but it may be held small enough when the driving signal $S_{OUT1}$ stays in LOW level. The present embodiment assumes that the mirror ratio is a quarter by setting resistance of resistors, R7 and R8, to be a quadruple of that of resistors, R5 and R6. Accordingly, the mirror current, IEF1d or IEF2d, when the input signal is in HIGH level may be considerably suppressed, and the increase of the power consumption of the LD driver may be also suppressed.

In FIG. 2, the transistor, Q3 or Q4, is positively biased after the rising edge of the driving signal G1 due to the recovery of the spiked signal provided to the emitter thereof, by which a substantial mirror current G4 flows in the mirror transistor, Q3 or Q4, which slightly weakens the charging of the input capacitor Cbe by the emitter current G3 provided from the buffer transistor, Q5 or Q6. Accordingly, the rising edge of the driving signal G1 is slightly degraded compared to those shown in FIGS. 2A and 2B. However, since the buffer transistor, Q5 or Q6, is extensively biased in positive for providing an enough current to charge the input capacitor Cbe, the negative contribution due to the mirror current, IEF1$d$ or IEF2$d$, may be almost ignored. Moreover, adjusting the cut-off frequency of the differentiation circuit of the capacitor, C1 or C2, and the resistor, R7 or R8, may further suppress the negative contribution of the mirror current, IEF1$d$ or IEF2$d$, to the rising edge.

In the embodiments shown in FIGS. 8 and 9, the differentiate filter receives the signal provided from the counter driving signal, $S_{INV2}$ $S_{INV1}$, with a phase equal to respective driving signals, $S_{OUT1}$ or $S_{OUT2}$. However, the input signal may be replaced as far as the condition of the phase thereof same with that of the driving signal is satisfied. The amplified signal INP2, or the driving signal $S_{OUT1}$ it self may be provided to the emitter of the mirror transistor Q4.

While several embodiments and variations of the present invention are described in detail herein, it should be apparent that the disclosure and teachings of the present invention will suggest many alternative designs to those skilled in the art.

I claim:

1. An LD driver to drive an LD, comprising:
an inverting amplifier for amplifying an input signal and outputting an amplified signal;
an emitter follower including a buffer transistor and a current source connected in series to said buffer transistor, said buffer transistor receiving said amplified signal and outputting a driving signal in an emitter thereof;
an output circuit for receiving said driving signal to drive said LD; and
a current-mirror circuit connected in series to said inverting amplifier, said current-mirror circuit including a mirror transistor to provide a mirror current to said output circuit, said mirror current reflecting a source current flowing in said inverting amplifier,
wherein said buffer transistor and said mirror transistor constitute a push-pull driver for driving said output circuit.

2. The LD driver of claim 1,
wherein said output circuit includes a pair of transistors constituting a differential circuit to drive said LD differentially by providing modulation currents complementary to others.

3. The LD driver of claim 1,
wherein said mirror current discharges carriers accumulated in an input capacitor of said output circuit.

4. The LD driver of claim 1,
wherein said mirror transistor is driven by a spiked signal synchronized with a falling edge of said driving signal.

5. The LD driver of claim 4,
wherein said mirror transistor is a bipolar transistor whose emitter is driven by said spiked signal.

6. The LD driver of claim 4,
wherein said spiked signal is generated by passing a signal whose phase is equal to a phase of said driving signal through a differentiating filter formed by a capacitor and a resistor connected in series to said capacitor.

7. The LD driver of claim 4,
wherein said current-mirror circuit has a mirror ratio less than unity.

8. The LD driver of claim 1,
further comprising a feedback circuit that feeds a current flowing in said output circuit back to a current flowing in said inverting amplifier so as to keep said current flowing in said output circuit in constant.

9. The LD driver of claim 8,
wherein said output circuit includes a paired transistor constituting a differential circuit with a common emitter connected to a reference resistor,
wherein said feedback circuit keeps a voltage induced in said reference resistor by said current flowing in said output circuit in constant.

10. An LD driver for driving an LD, comprising:
a pair of inverting amplifier each receiving an input signal complementary to others;
a pair of emitter followers each including a buffer transistor and a current source connected in series to said buffer transistor, said buffer transistor receiving said amplified signal and outputting a driving signal in an emitter thereof;
an output circuit including a pair of transistors constituting a differential circuit, each of said paired transistors receiving said one of driving signals;
a pair of current-mirror circuits each connected in series to one of said inverting amplifiers and including a mirror transistor for providing a mirror current, which reflects a source current flowing in said one of inverting amplifiers, to one of said paired transistors in said output circuit,
wherein said buffer transistor in said one of emitter followers and said mirror transistor in said one of current-mirror circuits constitute a push-pull circuit to drive said one of paired transistors in said output circuit.

11. The LD driver of claim 10,
wherein said LD is driven in a differential mode by being connected between said pair of transistors.

12. The LD driver of claim 10,
further comprising a feedback circuit,
wherein said inverting amplifiers provide a current source common to each other, said current source outputting said source current adjusted by said feedback circuit so as to keep a current flowing in said output circuit in constant.

13. The LD driver of claim 10,
wherein each of said current-mirror circuits further includes a source transistor symmetrically connected to said mirror transistor, said source transistor receiving said source current flowing in said one of inverting amplifier, said mirror transistor being connected to said one of paired transistors in said output circuit.

14. The LD driver of claim 13,
wherein said mirror transistor is driven by a spiked signal synchronized with said input signal.

15. The LD driver of claim 14,
wherein said spiked signal is generated from said input signal by passing through a differentiating filter constituted by a capacitor and a resistor connected in series to sad capacitor.

16. The LD driver of claim 14,
wherein said current-mirror circuit provides a mirror ratio less than unity.

17. The LD driver of claim 13,
wherein said mirror transistor is driven by a spiked signal synchronized with a rising edge of said driving signal output from said emitter follower not connected to said mirror transistor.

18. The LD driver of claim 17,
wherein said spiked signal is generated from said driving signal output from said emitter follower not connected to said mirror transistor by passing through a differentiating filter constituted by a capacitor and a resistor.

19. The LD driver of claim 17,
wherein said current-mirror circuit has a mirror ratio less than unity.

20. A push-pull driver for outputting a driving signal by receiving an input signal with LOW and HIGH level, comprising:
   an inverting amplifier for outputting an amplified signal by receiving said input signal, said amplified signal having a phase opposite to said input signal;
   an emitter follower including a buffer transistor configured to be an emitter follower circuit, said buffer transistor receiving said amplified signal and outputting said driving signal in an emitter thereof;
   a current-mirror circuit including a source transistor connected in series to said inverting amplifier and a mirror transistor symmetrically connected to said source transistor, said source transistor flowing a source current therein which is same with a current flowing in said inverting amplifier, said mirror transistor flowing a mirror current therein reflecting said source current,
   wherein said mirror transistor is connected to said emitter of said buffer transistor.

21. The push-pull driver of claim 20,
wherein said source transistor substantially turns off when said input signal is in said LOW level and said mirror transistor provides a mirror current only when said input signal is in said HIGH level.

22. The push-pull driver of claim 20,
wherein said emitter follower further includes a current source connected to said emitter of said buffer transistor, said current source stably providing a current to said buffer transistor.

23. The push-pull driver of claim 20,
wherein said mirror transistor is further driven by a spiked signal to provide a spiked current in addition to said mirror current, said spiked current synchronizing with a falling edge of said driving signal.

24. The push-pull driver of claim 23,
wherein said mirror transistor receives said spiked signal in an emitter thereof through a differentiating filter.

25. The push-pull driver of claim 24,
wherein said differentiating filter receives a signal whose phase is substantially equal to said input signal.

26. The push-pull driver of claim 23,
wherein said current-mirror circuit has a mirror ratio less than unity.

\* \* \* \* \*